(12) United States Patent
Vollrath et al.

(10) Patent No.: US 7,313,741 B2
(45) Date of Patent: Dec. 25, 2007

(54) INTEGRATED SEMICONDUCTOR MEMORY

(75) Inventors: Joerg Vollrath, Olching (DE); Marcin Gnat, Mering (DE); Aurel von Campenhausen, Cluvenhagen (DE); Frank Schroeppel, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 194 days.

(21) Appl. No.: 11/145,192

(22) Filed: Jun. 6, 2005

(65) Prior Publication Data

US 2005/0289413 A1  Dec. 29, 2005

(30) Foreign Application Priority Data

Jun. 4, 2004 (DE) .................... 10 2004 027 275

(51) Int. Cl.
*G01R 31/28* (2006.01)
(52) U.S. Cl. .................................... 714/718
(58) Field of Classification Search .................. None
See application file for complete search history.

(56) References Cited

U.S. PATENT DOCUMENTS

| | | | | |
|---|---|---|---|---|
| 4,162,375 A * | 7/1979 | Schlichte | .................. | 370/374 |
| 5,483,493 A * | 1/1996 | Shin | .................. | 365/201 |
| 6,484,289 B1 * | 11/2002 | Hsu | .................. | 714/820 |
| 6,550,026 B1 * | 4/2003 | Wright et al. | .................. | 714/719 |
| 6,721,230 B2 | 4/2004 | Weitz | | |
| 6,724,230 B2 * | 4/2004 | Hirabayashi | .................. | 327/280 |
| 6,856,577 B1 * | 2/2005 | Handa et al. | .................. | 367/119 |
| 7,013,413 B1 * | 3/2006 | Kim et al. | .................. | 714/719 |
| 2003/0217313 A1 * | 11/2003 | Pfeiffer et al. | .................. | 714/719 |
| 2004/0015757 A1 * | 1/2004 | Ohlhoff et al. | .................. | 714/719 |

FOREIGN PATENT DOCUMENTS

WO  WO 03/107354  12/2003

OTHER PUBLICATIONS

The Institute of Electrical and Electronics Engineering, Inc (IEEE); IEEE 100 the Authoritative Dictionary of IEEE Standards Terms; Dec. 2000; Standards Information Network IEEE Press; Seventh Edition; p. 1183.*
Nishimura, Y. et al., "A redundancy test-time reduction technique in 1-MBit DRAM with a Multibit Test Mode," IEEE Journal of solid-state circuits, vol. 24, No. 1, pp. 43-49, Feb. 1989.
Miyaji, F. et al., "A Multibit Test Trigger Circuit for MegaBit SRAM's," IEE Journal of solid-state circuits, vol. 25, No. 1, pp. 68-71, Feb. 1990.

* cited by examiner

*Primary Examiner*—Cynthia Britt
*Assistant Examiner*—Steven D Radosevich
(74) *Attorney, Agent, or Firm*—Edell, Shapiro & Finnan, LLC

(57) ABSTRACT

An integrated semiconductor memory includes memory cells that store a first data record has at least one datum with a first or second data value and a second data record has at least one datum with the first or second data value. The integrated semiconductor memory has a combination circuit that generates the third data record on the output side from the data records fed to the combination circuit on the input side to ascertain based on the third data record whether the first and second data records have been fed to the combination circuit on the input side. The combination circuit generates the datum of the third data record with the first data value, if the first and second data records were fed to the combination circuit on the input side.

14 Claims, 6 Drawing Sheets n=4

DS1=(D1a, D1b, D1c, D1d)=(0, 1, 0, 1);   DW1=0,   DW2=1

DS2=(D2a, D2b, D2c, D2d)=(1, 1, 1, 1);            DW2=1

| DS1 | DS2 | DS3 |
|-----|-----|-----|
| 0 | 1 | 1=D3a |
| 1 | 1 | 0=D3b |
| 0 | 1 | 1=D3c |
| 1 | 1 | 0=D3d | n=6

| DS1 | DS4 | DS36 |
|---|---|---|
| 0 | 1 | 1=D36a |
| 1 | 0 | 1=D36b |
| 0 | 1 | 1=D36c |
| 1 | 0 | 1=D36d |

| DS2 | DS36 | DS37 |
|---|---|---|
| 1 | 1 | 0=D37a |
| 1 | 1 | 0=D37b |
| 1 | 1 | 0=D37c |
| 1 | 1 | 0=D37d |

| DS1 | DS4 | DS36 |
|-----|-----|------|
| 5   | A   | F    |
| 5   | A   | F    |
| 5   | F   | A    |
| 5   | F   | A    |

| DS2 | DS36 | DS37 |
|-----|------|------|
| F   | F    | 0    |
| F   | F    | 0    |
| A   | A    | 0    |
| A   | A    | 0    |

INTEGRATED SEMICONDUCTOR MEMORY

CROSS-REFERENCE TO RELATED APPLICATION

This application claims priority under 35 U.S.C. §119 to German Application No. DE 10 2004 027 275.1, filed on Jun. 4, 2004, and titled "Integrated Semiconductor Memory," the entire contents of which are hereby incorporated by reference.

1. Field of the Invention

The invention relates to an integrated semiconductor memory with generation of a data record.

2. Background

Integrated semiconductor memories are subject to comprehensive tests during and after their fabrication in order to ensure their correct functioning. High-end test systems or low-end test systems are generally used for testing the integrated semiconductor memories. Low-end test systems can be used to test a plurality of memory chips in parallel, which can significantly lower test costs than with high-end test systems.

When testing memory cells arranged in a memory cell array of the integrated semiconductor memory, different data records are written to them. During the write operation, for test purposes, specific parameters important for the write access are set in critical fashion. During a subsequent read-out operation, the data records written in are read out again from the memory cells. In order to ascertain whether the write operation proceeded correctly at the critically set value of the parameter to be tested, the data records read out are compared with the data records previously read in. The data record that occurs at the output terminals during read-out of the integrated semiconductor memory is sampled by the test system at short time intervals in which the data succeed one another within an output data stream.

Present day memory chips, such as the Double Data Rate Dynamic Random Access Memory (DDR-DRAM) semiconductor memories, operate with clock frequencies greater than 400 MHz. Due to the high clock rates associated therewith and the even higher clock rates expected in the future, the tester must sample the output data stream in very short times in order to detect the individual data of the output data record. With the low-end test systems having a parallel capability, such high sampling frequencies generally cannot be realized or can be realized only with very great difficulty.

Even if a test system can sample an output data stream, for example, with a frequency of 400 MHz, in general, the time duration between two sampling pulses varies both in the case of a single tester over a relatively long period of time and between different testers. As a result, it is often not possible to detect all the data of an output data record. The correlation between read-in data of an input data record and read-out data of an output data record thus proves generally to be very difficult.

Although high-end test systems can operate with higher clock rates, high-end test systems are unsuitable for a parallel test of many devices. The test complexity and the test time are therefore significantly greater during a test with high-end test systems than when low-end test systems are used. As a result, realizing high sampling rates when reading out a data record from the memory cells of an integrated semiconductor memory cannot be solved viably in respect of costs by the use of high-end test systems.

Therefore, an integrated semiconductor memory and a method in which data of an output data record can be detected reliably and ascertained based on the data detected whether a first and second data record have been stored correctly are desirable.

SUMMARY

An integrated semiconductor memory includes output terminals, and a memory cell array with first and second memory cells. A first data record has at least one datum with a first or second data value stored in the first memory cells. A second data record includes at least one datum with the first or second data value stored in the second memory cells. The integrated semiconductor memory further includes a combination circuit with output terminals for generating a third data record from at least two data records fed to the combination circuit on the input side. The third data record has at least one datum with the first or second data value. The first data record and the second data record are fed to the combination circuit on the input side. A respective one of the output terminals of the combination circuit is connected to a respective one of the output terminals of the integrated semiconductor memory. The combination circuit has a first logic gate for generating a first output data record that has data with the first or second data value, a second logic gate for generating a second output data record that has data with the first or second data value, a multiplexer, and a logic circuit with at least one logic gate. The first data record and a fourth data record are fed to the first logic gate on the input side. The first logic gate generates the first output data record on the output side from the data records fed to the logic gate on the input side. The data values of the data of the first output data record match the data values of the data of the second data record, if the first data record and the fourth data record have been fed to the first logic gate on the input side. The second logic gate is fed, on the input side, the second data record from the second storage circuit and the first output data record from the first logic gate. The second logic gate generates, on the output side, a datum of the second output data record with the first data value, if the first output data record fed to the second logic gate on the input side matches the second data record fed to the second logic gate on the input side, and generates in each case a datum of the second output data record with the second data value, if the first output data record fed to the second logic gate on the input side differs from the second data record fed to the second logic gate on the input side. The data of the second output data record are fed to the multiplexer on the input side. The multiplexer, on the output side, in each case feeds two data of the second output data record to a respective one of the logic gates of the logic circuit. The logic circuit generates, on the output side, the datum of the third data record with the first data value from the data of the second output data record fed to the logic circuit, if the first data record and the second data record have been fed to the combination circuit on the input side. The logic circuit also generates the datum of the third data record with the second data value, if the data records fed to the combination circuit on the input side differ from the first data record and the second data record. The logic circuit is connected to one of the output terminals of the integrated semiconductor memory on the output side.

In one implementation of the integrated semiconductor memory, the first and second logic gates of the combination circuit are each an XOR gate, and the logic gates of the logic circuit are each an OR gate.

In an exemplary embodiment, the integrated semiconductor memory includes a first storage circuit for storing a data record and a second storage circuit for storing a further data record. The first data record stored in the first memory cells are fed to the first storage circuit. The second data record stored in the second memory cells are fed to the second storage circuit.

In accordance with a further embodiment of the integrated semiconductor memory, the first data record is fed to the combination circuit on the input side from the first storage circuit. The second data record is fed to the combination circuit on the input side from the second storage circuit.

In accordance with a further feature of the integrated semiconductor memory, the integrated semiconductor memory is operated in a test operating mode. The integrated semiconductor memory has a controllable switch. The first and second memory cells are connected to the first and second storage circuits via the controllable switch. The integrated semiconductor memory further includes a control circuit for controlling the controllable switch. In the test operating mode of the integrated semiconductor memory, the control circuit drives the controllable switch such that, during the read-out of the first data record, the first memory cells are connected to the first storage circuit via the controllable switch and, during the read-out of the second data record, the second memory cells are connected to the second storage circuit via the controllable switch.

In a further embodiment of the integrated semiconductor memory, the integrated semiconductor memory is operated in a normal operating mode. A respective datum of the first and second data records is fed to a respective one of the output terminals of the integrated semiconductor memory via the controllable switch. During a read-out operation in the normal operating mode of the integrated semiconductor memory, the control circuit drives the controllable switch such that a respective datum of the data of the first and second data records is fed to a respective one of the output terminals of the integrated semiconductor memory via the controllable switch. The read-out operation for reading out the data of the first and second data records, in the normal operating mode of the integrated semiconductor memory, takes place during a first read-out duration.

In accordance with a further embodiment of the integrated semiconductor memory, the integrated semiconductor memory has output terminals and a memory cell array with first and second memory cells. A first data record includes at least one datum with a first data value stored in the first memory cells. A second data record includes at least one datum with a second data value stored in the second memory cells. Further, the integrated semiconductor memory includes a combination circuit with output terminals for generating a third data record from at least two data records fed to the combination circuit on the input side. The third data record includes at least one datum with the first or second data value. The first and second data records are fed to the combination circuit on the input side. A respective one of the output terminals of the combination circuit is connected to a respective one of the output terminals of the integrated semiconductor memory. The combination circuit includes at least one filter circuit for generating a data record and a multiplexer. The first data record is fed to the filter circuit. The second data record and the data record generated by the filter circuit are fed to the multiplexer on the input side. The multiplexer feeds a datum of the data record fed thereto on the input side from the filter circuit and a datum of the second data record to a respective one of the output terminals of the combination circuit. The multiplexer further generates the third data record from two data records fed thereto on the input side. The third data record includes the data of the data records fed to the multiplexer on the input side. The filter circuit is designed such that the data of the third data record generated by the multiplexer have either the first data value or the second data value.

In accordance with one implementation of the integrated semiconductor memory, the filter circuit is an inverter circuit.

In another embodiment of the integrated semiconductor memory according to the present invention, the integrated semiconductor memory has a first storage circuit for storing a data record and a second storage circuit for storing a further data record. The first data record stored in the first memory cells are fed to the first storage circuit. The second data record stored in the second memory cells are fed to the second storage circuit.

In accordance with another implementation of the integrated semiconductor memory, the first data record is fed to the combination circuit on the input side from the first storage circuit. The second data record is fed to the combination circuit on the input side from the second storage circuit. In accordance with a further feature of the integrated semiconductor memory according to the present invention, the integrated semiconductor memory operates in a test operating mode. The integrated semiconductor memory has a controllable switch. The first and second memory cells are connected to the first and second storage circuits by the integrated semiconductor memory. Furthermore, the integrated semiconductor memory includes a control circuit for controlling the controllable switch. In the test operating mode of the integrated semiconductor memory, the control circuit drives the controllable switch such that, during the read-out of the first data record, the first memory cells are connected to the first storage circuit via the controllable switch and, during the read-out of the second data record, the second memory cells are connected to the second storage circuit via the controllable switch.

In a further exemplary embodiment, the integrated semiconductor memory operates in a normal operating mode. A respective datum of the first and second data records are fed to a respective one of the output terminals of the integrated semiconductor memory via the controllable switch. During a read-out operation in the normal operating mode of the integrated semiconductor memory, the control circuit drives the controllable switch such that a respective datum of the data of the first and second data records is fed to a respective one of the output terminals of the integrated semiconductor memory via the controllable switch. The read-out operation for reading out the data of the first and second data records, in the normal operating mode of the integrated semiconductor memory, takes place during a first read-out duration.

A method for testing an integrated semiconductor memory includes reading in a first data record having at least one datum of a first or second data value into first memory cells of a memory cell array. Afterward, a second data record includes at least one datum of the first or second data value is read into second memory cells of the memory cell array. The first data record is subsequently read out from the first memory cells. The second data record is subsequently read out from the second memory cells. This is followed by driving a combination circuit for combining data records with the first data record and the second data record. A first output data record is subsequently generated in the combination circuit by combining the data of the first data record with the data of a fourth data record. The data values of the data of the first output data record match the data values of the data of the second data record. A second output data record is generated by combining the data of the second data record with the data of the first output data record. In each case, a datum of the second output data record is generated with the first data value, if a datum of the data of the first output data record matches a datum of the data of the second data record, and a datum of the second output data record is generated with the second data value, if the one datum of the data of the first output data record differs from the one datum of the data of the second data record.

An exemplary method for testing an integrated semiconductor memory includes generating a third data record with a datum by logic combination of the data of the second output data record.

Another embodiment of a method for testing an integrated semiconductor memory includes reading in a first data record having at least one datum of a first or second data value into first memory cells of a memory cell array. Afterward, a second data record having at least one datum of the first or second data value is read into second memory cells of the memory cell array. The first data record is subsequently read out from the first memory cells. The second data record is subsequently read out from the second memory cells. A combination circuit for combining data records is subsequently driven with the first data record and the second data record. The data of the first data record are inverted by the combination circuit. A third data record is subsequently generated by the combination circuit. The third data record has the inverted data of the first data record and the data of the second data record.

BRIEF DESCRIPTION OF THE DRAWINGS

The invention is explained in more detail below with reference to figures showing exemplary embodiments of the invention, in which:

FIG. 5B shows a third embodiment of the combination of the first and second data records to form the third data record in accordance with the invention, and FIG. 5C shows a fourth embodiment of the combination of the first and second data records to form the third data record in accordance with the invention.

DETAILED DESCRIPTION

Figure 1:
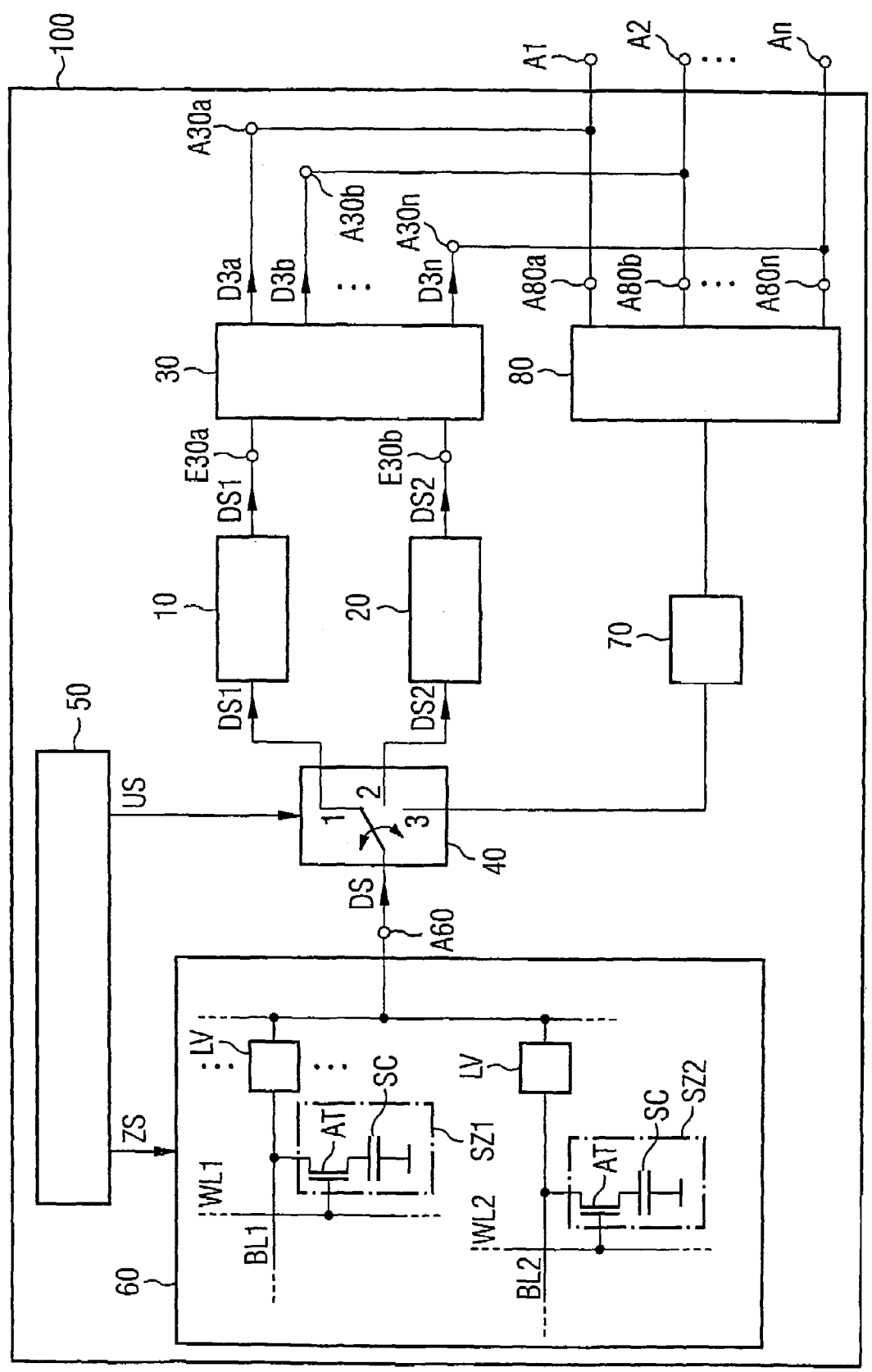
FIG. 1 shows an integrated semiconductor memory in accordance with the invention.

FIG. 1 shows an integrated semiconductor memory 100 having a memory cell array 60. The memory cell array 60 has first and second memory cells SZ1 and SZ2, which are each formed as DRAM memory cells. The two memory cells each have a selection transistor AT and a storage capacitor SC. The selection transistor AT is turned on for a write or read access to the first memory cell SZ1 or the second memory cell SZ2 by driving a word line WL1 or WL2, respectively. The storage capacitor SC of the respective memory cell is conductively connected to a bit line BL1 or BL2, respectively. During a read-out operation, depending on the charge state of the storage capacitor SC, a potential increase or potential decrease, which is amplified by a sense amplifier LV to form a defined high or low voltage level, arises on the connected bit line. The high voltage level corresponds to a logic 1 information item, whereas the low voltage level corresponds to a logic 0 information item.

Different data records are stored in the memory cells of the memory cell array 60. Within the memory cell array 60, the first memory cell SZ1 stores, for example, a first data record DS1, whereas the second memory cell SZ2 stores a second data record DS2. The first and second data records include at least one datum D1$a$ and D2$a$, respectively, with a first data value DW1 or a second data value DW2. The data values, for instance, have the logic data value 0 or 1. In order to control the reading in or reading out of the first and second data records into the first and second memory cells, the memory cell array 60 is driven with a memory access signal ZS by a control circuit 50.

When the first and second data records are read out, a data record DS having the data of the first and second data records arises at an output terminal A60 of the memory cell array 60. In order to read out the data record DS, the control circuit 50 drives a controllable switch 40 with a changeover signal US, so that the data record DS is fed to a driver circuit 70 in a switch position 3 of the controllable switch 40. Data values of data of the data record DS are amplified by the driver circuit 70 and fed to a multiplexer 80. The multiplexer 80 generates a respective datum of the data record DS at output terminals A80$a$, A80$b$, ..., A80$n$ of the multiplexer 80. The data is fed to output terminals A1, A2, ..., An of the integrated semiconductor memory 100. The integrated semiconductor memory is operated, for instance, in a normal operating mode in switch position 3.

If the intention is not to detect the individual data values of data of the first and second data records DS1 and DS2, but to ascertain whether the first data record DS1 has been stored correctly in the first memory cells SZ1 and the second data record DS2 has been stored correctly in the second memory cells SZ2, for example, when testing the integrated semiconductor memory, the controllable switch 40 is switched into a first switch position 1 or into a second switch position 2 by the control circuit 50 with the aid of the changeover signal US. The integrated semiconductor memory is therefore, for instance, operated in a test operating mode in switch position 1 or 2. In order to read out the first data record DS1 from the first memory cells SZ1, the controllable switch 40 is switched into switch position 1 by the control circuit 50. As a result, the data of the data record DS1 are buffer-stored in a first storage circuit 10. When the second data record DS2 is read out, the controllable switch is switched into switch position 2, so that the data of the second data record is read out from the second memory cells SZ2 and buffer-stored in a second storage circuit 20.

The first data record DS1 is fed to a combination circuit 30 via a first input terminal E30$a$. The second data record DS2 is fed to the combination circuit 30 via a second input terminal E30$b$. The combination circuit 30 generates a third data record DS3 from the first and second data records DS1 and DS2 fed to it on the input side. The third data record includes at least one datum D3$a$ with the first data value DW1 or the second data value DW2. The data D3$a$, D3$b$, ..., D3$n$ of the third data record are fed via output terminals A30$a$, A30$b$, ..., A30$n$ of the combination circuit 30 to a respective one of the output terminals A1, A2, ..., An of the integrated semiconductor memory 100. The combination circuit 30 combines the data of the first data record DS1 fed to the combination circuit on the input side with the data of the second data record DS2 fed to the combination circuit on the input side to form data D3a, D3b, ..., D3n of the third data record DS3 such that, based on the data of the third data record, the combination circuit determines whether the combination circuit has been fed, on the input side, the first data record DS1 at the first input terminal E30a and the second data record DS2 at the second input terminal E30b.

The following figures each show exemplary embodiments of the combination circuit 30 and embodiments of the third data record DS3, including data D3a, ..., D3n with data values DW1 or DW2, which has been produced from a combination of the data D1a, ..., D1n of the first data record DS1 with the data D2a, ..., D2n of the second data record DS2.

Figures 2A, 2B:
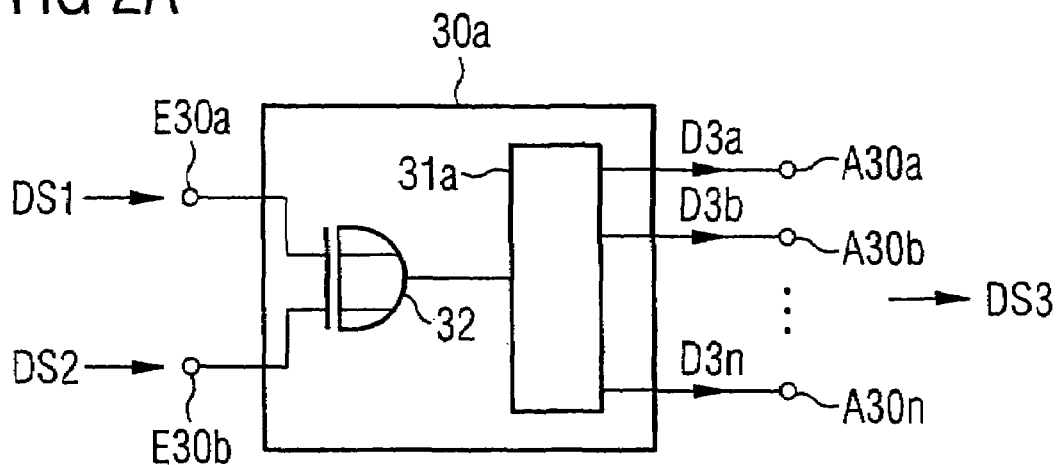
FIG. 2A shows a first embodiment of a combination circuit of the integrated semiconductor memory in accordance with the invention.
FIG. 2B shows a first embodiment of the combination of a first and second data record to form a third data record in accordance with the invention.

FIG. 2A shows a first embodiment of the combination circuit 30a for generating the third data record DS3 including the data D3a, D3b, ..., D3n. In the first embodiment of the combination circuit 30a illustrated, a datum of the first data record DS1 is each compared with a datum of the second data record DS2 and, on the output side, the datum of the third data record DS3 is generated with a first data value, for example, a logic low level, if the data value of the datum of the first data record DS1 matches the data value of the datum of the second data record DS2. By contrast, if a comparison of a data value of a datum of the first data record DS1 with a data value of a datum of the second data record DS2 reveals that the two data values differ from one another, then a datum of the third data record DS3 is generated with a second level, for example, a high level, on the output side.

In order to realize a combination circuit of this type, the combination circuit 30a includes a multiplexer 31a and an XOR gate 32. The XOR gate 32 is fed, on the input side, the data of the first data record DS1 at the first input terminal E30a of the combination circuit 30a and the data of the second data record DS2 at the second input terminal E30b of the combination circuit 30a. As a result of the XOR combination of a datum of the first data record with a datum of the second data record, the datum of the third data record DS3 is generated with the logic 0 level on the output side, if the datum of the first data record matches the datum of the second data record. Conversely, the datum of the third data record is generated with the logic 1 level on the output side, if the data value of the datum of the first data record differs from the data value of the datum of the second data record. The data D3a, D3b, ..., D3n of the third data record DS3 are fed from the multiplexer 31 to a respective one of the output terminals A30a, A30b, ..., A30n of the combination circuit 30.

FIG. 2B shows an example of a combination of the first data record DS1 with the second data record DS2 to form the third data record DS3 with the aid of the combination circuit 30a. The data records each have the length n=4. The data record DS1 includes the data D1a, D1b, D1c and D1d, where the individual data may each assume the data value DW1=0 or DW2=1. The data record DS2 includes the data D2a, D2b, D2c and D2d, which each assume the data value DW2=1. The table in FIG. 2B illustrates the third data record DS3 with the data D3a, D3b, D3c and D3d, which has been produced from an EXOR combination of the data of the first data record DS1 with the data of the second data record DS2. Due to the XOR combination, the data of the third data record DS3 are generated with the logic 0 level, if the datum of the first data record matches the datum of the second data record. Conversely, the datum of the third data record is generated with the logic 1 level, if the datum of the first data record differs from the datum of the second data record.

If the data of the first data record DS1 and the data of the second data record DS2 are assumed to be known, based on the data of the third data record DS3, it can be determined whether the first data record DS1 and the second data record DS2 have been fed to the combination circuit 30a on the input side. In contrast to the evaluation of each individual datum of the first and second data records, i.e., the example of FIG. 2B, evaluation of a total of eight data D1a, ..., D1d, and D2a, ..., D2d of the first and second data records DS1 and DS2, a tester connected to the output terminals of the integrated semiconductor memory of FIG. 1 evaluates four data D3a, ... D3d of the data record DS3. The sampling frequency when reading out the data record DS3 is halved in comparison with reading out the data of the data record DS1 and the data record DS2 within the same time.

Figure 3A:
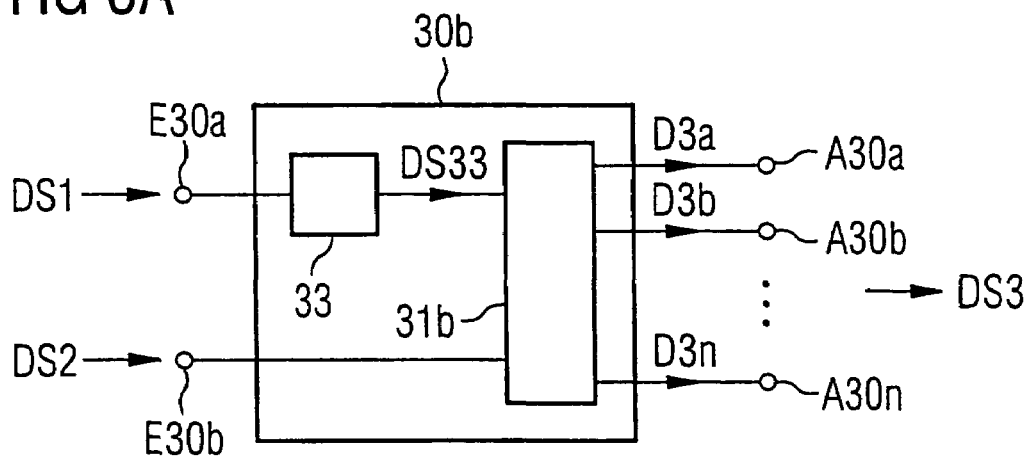
FIG. 3A shows a second embodiment of the combination circuit in accordance with the invention.

FIG. 3A shows a second embodiment of the combination circuit 30b. In this case, the data D3a, D3b, ... D3n of the third data record DS3 generated on the output side have at most the number of different data values of the first and second data records DS1 and DS2. The combination circuit 30b has a multiplexer 31b and a filter circuit 33. The data of the first data record DS1 is fed to the filter circuit 33 on the input side via the first input terminal E30a of the combination circuit 30b. The filter circuit 33 generates a data record DS33 on the output side, which data record is fed to the input side of the multiplexer 31b. The second data record DS2 is fed to the multiplexer 31 on the input side via the second input terminal E30b of the combination circuit 30b. The multiplexer 31 generates, from the filtered data of the first data record DS1 and the data of the second data record DS2, the data D3a, D3b, ..., D3n of the data record DS3 at a respective one of its output terminals A30a, A30b, ..., A30n.

Figure 3B:
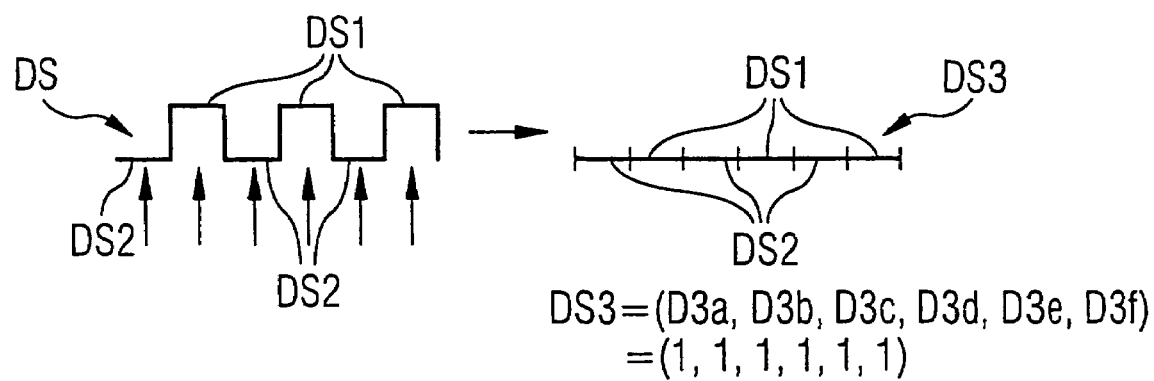
FIG. 3B shows a second embodiment of the combination of a first and second data record to form a third data record in accordance with the invention.

FIG. 3B shows an example of the generation of the third data record DS3 from the first and second data records DS1 and DS2 by the combination circuit 30b. FIG. 3B shows the data record DS which is generated at the output terminal A60 of the memory cell array 60 of FIG. 1 and includes data of the first data record DS1 and data of the second data record DS2. In the example of FIG. 31B, the first and second data records DS1 and DS2 each have the length n=6. The first data record DS1 includes the data D1a, D1b and D1c, which each assume the data value DW1=0. The second data record DS2 includes the data D2a, D2b and D2c, which each assume the data value DW2=1. In the case of this special configuration of the first and second data records, the filter circuit 33 is, for example, an inverter circuit. The data values DW1=0 of data of the first data record DS1 are thereby inverted, so that the data record DS33 has data with the data value DW2=1. Consequently, data of the third data record DS3 with the logic 0 level arise at the output terminals A30a, A30b, ..., A30n of the combination circuit 30b.

In this case, a tester connected to the output terminals A1, A2, ..., An of the integrated semiconductor memory 100 detects a single data value, the data value DW1=0 in the example of FIG. 3B. The sampling of the individual data of the third data record DS3 by the tester by sampling pulses, which are illustrated by arrows in each sampling interval of the data record DS in FIG. 3B, are avoided. As soon as the tester ascertains, during the read-out time for the third data record, a discontinuity in the voltage level at the output terminals of the integrated semiconductor memory, it is possible to deduce an error in the feeding of the first and second data records on the input side. The generation of sampling pulses and the adherence to the precise sampling intervals are obviated.

Figure 4:
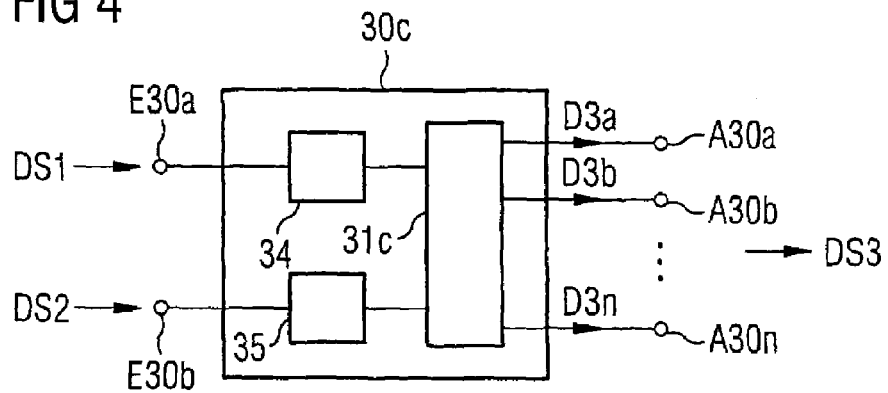
FIG. 4 shows a third embodiment of the combination circuit in accordance with the invention.

FIG. 4 shows a further embodiment of the combination circuit 30c. In this case, the combination circuit 30c is designed such that the first and second data records in a test operating mode of the integrated semiconductor memory, are fed to the output terminals A30a, A30b, . . . , A30n of the combination circuit 30c. During a read-out operation in the normal operating mode of the integrated semiconductor memory, the controllable switch 40 is in switch position 3. In this operating state, the data records DS1 and DS2 are read out via the driver circuit 70 and the multiplexer 80 during a first read-out time, which generally depends on the clock rate with which the integrated semiconductor memory is operated. In contrast to this, the first and second data records are output in a manner delayed by the combination circuit 30c during a read-out operation in switch position 1 and 2 of the controllable switch 40 in the test operating mode. The combination circuit 30c includes a first delay circuit 34, to which the first data record DS1 is fed on the input side via the first input terminal E30a of the combination circuit 30c. The second data record DS2 is fed to a second delay circuit 35 on the input side via the second input terminal E30b of the combination circuit 30c. In this case, the two delay circuits are designed such that the first delay circuit 34 generates, on the output side, the first data record DS1 during a second read-out time duration and the second delay circuit 35 generates the second data record DS2 during a third read-out time duration after the end of the operation of reading out the first data record, the second, and third read-out time durations being at least twice as long as the first read-out time duration for a read-out operation in the normal operating mode of the integrated semiconductor memory.

In this embodiment of the combination circuit 30c, although a test system connected to the output terminals A1, A2, . . . , An detects each individual datum of the first and second data records, it is possible to halve the sampling frequency for sampling the individual data in comparison with the normal operating state.

Figure 5A:
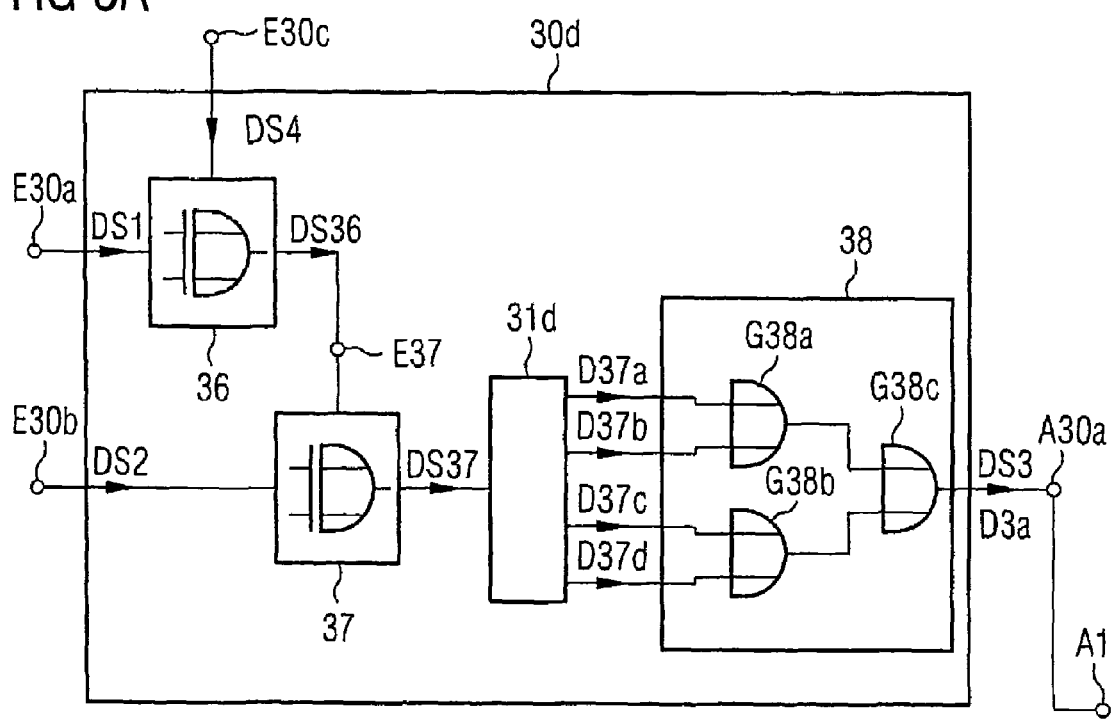
FIG. 5A shows a fourth embodiment of the combination circuit in accordance with the invention.

FIG. 5A shows a fourth embodiment of the combination circuit 30d, which generates the third data record DS3 with one datum D3a. The first input terminal E30a of the combination circuit 30d is connected to a first logic gate 36 on the input side. The first data record DS1 is fed to the first logic gate 36 via the first input terminal E30a of the combination circuit 30d. A fourth data record DS4 is fed to the first logic gate 36 on the input side via a third input terminal E30c of the combination circuit 30d. In this case, the first logic gate 36 generates on the output side a data record DS36 corresponding to the second data record DS2, if the first data record DS1 and the fourth data record DS4 have been fed to the first logic gate 36 on the input side. The second data record DS2 is fed to a second logic gate 37 on the input side via the second input terminal E30b of the combination circuit 30d. The data record DS36 generated by the first logic gate 36 is fed to the second logic gate 37 via an input terminal E37 thereof. The second logic gate 37 generates a data record DS37 on the output side. The data of the data record DS37 has the first data value, for example, the logic value 0, if two identical data records are fed to the second logic gate 37 on the input side. However, if the two data records fed on the input side differ, the second logic gate 37 generates the data of the data record DS37 with the second data value, for example, the logic value 1, on the output side. A multiplexer 31d generates a datum D37a, D37b, D37c, D37d of the data record DS37 on the output side from the data record DS37 fed to the multiplexer on the input side. The individual data of the data record DS37 are fed to a logic circuit 38. In the example of FIG. 5A, the logic circuit 38 includes three OR gates G38a, G38b, G38c. The logic circuit has the hierarchical construction of the OR gates, as illustrated in FIG. 5A. In this case, a datum is generated on the output side from two data, for example, data D37a and D37b. The OR gate G38c generates the third data record DS3, which includes the datum D3a, on the output side from the four data D37a, D37b, D37c, D37d. The datum is fed via the output terminal A30a of the combination circuit 30d to one of the output terminals, for example, the output terminal A1, of the integrated semiconductor memory 100. Based on the data value of the datum D3a of the third data record DS3, it is possible to ascertain whether the combination circuit 30d has been fed the first data record DS1 at its first input terminal E30a and the second data record DS2 at its second input terminal E30b.

FIG. 5B illustrates how the combination circuit 30d of FIG. 5A generates the data record DS37 from a first data record DS1 and a second data record DS2. The first data record DS1 includes the data D1a, D1b, D1c and D1d, in which the data values DW1=0 and DW2=1 are alternately stored. The second data record DS2 includes the data D2a, D2b, D2c and D2d, which each have the data value DW2=1. The fourth data record DS4 includes the data D4a, D4b, D4c, D4d, the data alternately having the data values DW2=1 and DW1=0. The first table illustrates how the first logic gate 36, which is an XOR gate in the example of FIG. 5B, generates the data record DS36, which corresponds to the second data record DS2 in this case, from the first data record DS1 and the fourth data record DS4. The second table illustrates how the second logic gate 37 generates the data record DS37 from the second data record DS2 fed to the second logic gate on the input side and the data record DS36 fed to the second logic gate on the input side. In the example of FIG. 5B, the second logic gate 37 is likewise an XOR gate. Since the data values of the data of the second data record DS2 match the data values of the data of the data record DS36, the four data D37a, D37b, D37c, D37d of the data record DS37 each have the data value DW1=0. The logic circuit 38 each combine the datum D37a with the datum D37b and the datum D37c with the datum D37d. Due to the hierarchical construction of the logic circuit 38, the OR gate G38c generates on the output side the third data record DS3 with the datum D3a of the data value DW1=0 since the second data record DS2 matches the data record DS36.

FIG. 5C shows a further example of how two data records DS1, DS2 are combined to form a single datum D3a of the third data record DS3 by the combination circuit 30d. The first data record DS1 includes the data D1a, . . . , D10 with alternate data values 0 and 1. In hexadecimal notation, the data record DS1 is represented as DS1=5555. The second data record DS2 includes the data D2a, . . . , D20, the first half of the data having the data value 1 and the second half of the data having the data value 1 and 0 in an alternate order. In hexadecimal notation, the second data record DS2 is represented as DS2=FFAA. The fourth data record DS4 includes the data D4a, . . . , D40, the first half of the data alternately assuming the data values 1 and 0 and the second half of the data having the data value 1. In hexadecimal notation, the fourth data record DS4 is represented as DS4=AAFF. The first table shows the XOR combination of the data record DS1 with the data record DS4 by the first logic XOR gate 36. On the output side, the data record DS36 is generated, in hexadecimal notation, with the data values FFAA. Since the first data record was fed correctly to the first logic gate 36 on the input side, the data values of the data of the data record DS36 correspond to the data values of the data of the second data record DS2. The second table illustrates how the second logic XOR gate 37 generates the data record DS37 from the second data record DS2 fed to the second logic gate on the input side and the data record DS36 fed to the second logic gate on the input side. Since the data values of the data of the second data record DS2 match the data values of the data of the data record DS36, the four data of the data record DS37 each have the data value 0. The logic circuit 38 combines the datum D37a with the datum D37b and the datum D37c with the datum D37d. Due to the hierarchical construction of the logic circuit 38, the OR gate G38c generates on the output side the third data record DS3 with the datum D3a of the data value 0 since the second data record DS2 matches the data record DS36. The data values represented in hexadecimal notation of the data of the first and second data records are stored in the first and second memory cells with the binary first and second data values DW1=0 and DW2=1.

In the case of this exemplary embodiment of the combination circuit 30d, a tester connected to the output terminal A1 evaluates a single datum D3a of the third data record. The sampling frequency with which the tester generates sampling pulses for sampling individual data of a data record is unimportant in this case since it is necessary merely to detect a single datum which is generated for a sufficiently long time for detection for the tester at the output terminal A1.

While the invention has been described in detail and with reference to specific embodiments thereof, it will be apparent to one skilled in the art that various changes and modifications can be made therein without departing from the spirit and scope thereof. For example, some or all of the subject matter may be embodied as software, hardware or a combination thereof. Accordingly, it is intended that the present invention covers the modifications and variations of this invention provided they come within the scope of the appended claims and their equivalents.

| List of Reference Symbols: | |
|---|---|
| 10 | First storage circuit |
| 20 | Second storage circuit |
| 30 | Combination circuit |
| 31 | Multiplexer |
| 32, 36, 37 | Logic gates (XOR gates) |
| 33 | Filter circuit |
| 34, 35 | Delay circuit |
| 38 | Logic circuit |
| 40 | Controllable switch |
| 50 | Control circuit |
| 60 | Memory cell array |
| 70 | Driver circuit |
| 80 | Multiplexer |
| 100 | Integrated semiconductor memory |
| A | Output terminal |
| AT | Selection transistor |
| BL | Bit line |
| D | Datum |
| DS | Data record |
| DW | Data value |
| E | Input terminal |
| G38 | Logic gate (OR gate) of the logic circuit |
| LV | Sense amplifier |
| SC | Storage capacitor |
| SZ | Memory cell |

-continued

| List of Reference Symbols: | |
|---|---|
| US | Changeover signal |
| WL | Word line |
| ZS | Access signal |

What is claimed is:

1. An integrated semiconductor memory, comprising:
 a memory cell array including first and second memory cells configured to store first and second data records, respectively, the first data record having at least one datum with a first or second data value stored in the first memory cells, and the second data record having at least one datum with the first or second data value stored in the second memory cells;
 a combination circuit configured to generate a third data record from a combination of at least the first and second data records, the third data record having at least one datum with the first or second data value, wherein the combination circuit comprises:
 a first logic gate that generates a first output data record from the first data record and a fourth data record such that values of the first output data record match values of the second data record under error-free conditions;
 a second logic gate that generates a second output data record from the second data record and the first output data record, wherein the second output data record has a first value in response to the first output data record matching the second data record and has a second value in response to the first output data record differing from the second data record;
 a multiplexer configured to multiplex data of the second output data record to a plurality of multiplexer outputs; and
 a logic circuit including at least one logic gate that produces the third data record from data received from the multiplexer outputs; and
 at least one output terminal configured to receive the third data record from the combination circuit.

2. The integrated semiconductor memory of claim 1, wherein the first and second logic gates of the combination circuit comprise XOR gates, and the at least one logic gate of the logic circuit comprises an OR gate.

3. The integrated semiconductor memory of claim 1, further comprising:
 a first storage circuit for storing the first data record retrieved from the first memory cells; and
 a second storage circuit for storing the second data record retrieved from the second memory cells.

4. The integrated semiconductor memory of claim 3, wherein the first and second storage circuits respectively supply the first and second data records to the combination circuit.

5. The integrated semiconductor memory of claim 3, wherein the integrated semiconductor memory is operable in a test operating mode and further comprises:
 a controllable switch coupling the first and second memory cells to the first and second storage circuits; and
 a control circuit for controlling the controllable switch such that, in the test operating mode, the first memory cells are coupled to the first storage circuit during read-out of the first data record, and the second memory cells are coupled to the second storage circuit during read-out of the second data record.

6. The integrated semiconductor memory of claim 5, wherein, during a normal operating mode, the control circuit drives the controllable switch to supply the first and second data records to the output terminals of the integrated semiconductor memory.

7. An integrated semiconductor memory, comprising:
a memory cell array including first and second memory cells configured to store first and second data records, respectively, the first data record having at least one datum with a first data value stored in the first memory cells, and the second data record having at least one datum with a second data value stored in the second memory cells;
a combination circuit configured to generate a third data record from the first and second data records, the third data record having at least one datum with the first or second data value, wherein the combination circuit includes:
 a filter circuit that generates an output data record from the first data record; and
 a multiplexer that generates the third data record from the second data record and the output data record from the filter circuit, the filter circuit being configured such that the data of the third data record has only the data value of the second data record; and
at least one output terminal configured to receive the third data record from the combination circuit.

8. The integrated semiconductor memory of claim 7, wherein the filter circuit comprises an inverter circuit.

9. The integrated semiconductor memory of claim 7, further comprising:
a first storage circuit for storing the first data record retrieved from the first memory cells; and
a second storage circuit for storing the second data record retrieved from the second memory cells.

10. The integrated semiconductor memory of claim 9, wherein the first and second storage circuits respectively supply the first and second data records to the combination circuit.

11. The integrated semiconductor memory of claim 9, wherein the integrated semiconductor memory is operable in a test operating mode and further comprises:
a controllable switch coupling the first and second memory cells to the first and second storage circuits; and
a control circuit for controlling the controllable switch such that, in the test operating mode, the first memory cells are coupled to the first storage circuit during read-out of the first data record, and the second memory cells are coupled to the second storage circuit during read-out of the second data record.

12. The integrated semiconductor memory of claim 11, wherein, during a normal operating mode, the control circuit drives the controllable switch to supply the first and second data records to the output terminals of the integrated semiconductor memory.

13. A method for testing an integrated semiconductor memory, comprising:
writing a first data record comprising at least one datum of a first or second data value into first memory cells of a memory cell array;
writing a second data record comprising at least one datum of the first or second data value into second memory cells of the memory cell array;
reading out the first data record from the first memory cells;
reading out the second data record from the second memory cells;
driving a combination circuit for combining at least the first data record and the second data record;
generating a first output data record in the combination circuit by combining data of the first data record with data of a fourth data record, wherein data values of the data of the first output data record match the data values of the data of the second data record under error-free conditions; and P1 generating a second output data record by combining the data of the second data record with the data of the first output data record, wherein the second output data record has a first value in response to the first output data record matching the second data record and has a second value in response to the first output data record differing from the second data record.

14. The method of claim 13, further comprising:
generating a third data record from a logic combination of the data of the second output data record.

* * * * *